United States Patent [19]
Lindley et al.

[11] Patent Number: 5,708,056
[45] Date of Patent: Jan. 13, 1998

[54] HOT MELT EPOXY ENCAPSULATION MATERIAL

[75] Inventors: Theresa Renee Lindley; Samuel R. Wennberg, both of Kokomo; Henry Morris Sanftleben, Carmel; James M. Rosson, Kokomo, all of Ind.; Ralph D. Hermansen, Northridge, Calif.

[73] Assignees: Delco Electronics Corporation, Kokomo, Ind.; Hughes Electronics, Los Angeles, Calif.

[21] Appl. No.: 566,519

[22] Filed: Dec. 4, 1995

[51] Int. Cl.$^6$ .............................. C08K 7/20; C08L 63/02; C08L 63/04
[52] U.S. Cl. .................... 523/220; 523/428; 523/429
[58] Field of Search .................. 523/220, 428, 523/429

[56] References Cited

U.S. PATENT DOCUMENTS

| | | | |
|---|---|---|---|
| 5,041,474 | 8/1991 | Kim et al. | 523/428 |
| 5,084,532 | 1/1992 | Schenkel | 523/428 |
| 5,137,940 | 8/1992 | Tomiyoshi et al. | 523/220 |
| 5,243,133 | 9/1993 | Engle et al. | 174/52.4 |
| 5,288,944 | 2/1994 | Bronson et al. | 174/52.4 |
| 5,494,950 | 2/1996 | Asakage et al. | 523/428 |

FOREIGN PATENT DOCUMENTS

| | | | |
|---|---|---|---|
| 34052 | 2/1986 | Japan | 523/220 |
| 10132 | 1/1987 | Japan | 523/220 |

OTHER PUBLICATIONS

Lee et al., "Handbook of Epoxy Resins", McGraw Hill Book Co. NY, pp. 7/15 & 10/17 (Reissue 1982).
Emerick et al., "Enhancement of TSOP Solder Joint Reliability Using Encapsulation," IEEE Proceedings.

*Primary Examiner*—Donald R. Wilson
*Attorney, Agent, or Firm*—Jimmy L. Funke

[57] ABSTRACT

A method and encapsulation material are provided for processing an electronic circuit assembly having surface mount integrated circuit packages mounted with soldered leads to its substrate, in which encapsulation of the soldered lead joints serves to enhance the fatigue life of the solder joints. The encapsulation material is a reactive hot melt epoxy that is curable at temperatures significantly lower than that required for previous epoxy-based encapsulation materials. As such, processing of the circuit assembly is greatly facilitated, while the benefit of encapsulated solder joints is achieved for the assembly. The encapsulation material further includes a latent curative and a filler material for lower the coefficient of thermal expansion of the encapsulation material.

13 Claims, 1 Drawing Sheet

HOT MELT EPOXY ENCAPSULATION MATERIAL

The present invention generally relates to techniques for improving solder joint fatigue life of surface mount integrated circuit packages. More particularly, this invention relates to an improved encapsulation material whose use is compatible with conventional circuit processes, reduces material and equipment costs, and makes possible the production of integrated circuit packages whose lead solder joints exhibit improved fatigue life.

BACKGROUND OF THE INVENTION

Electronic circuit assemblies are often required to be capable of surviving in hostile operating environments, including those commonly found in automotive and aerospace applications. Such assemblies often employ surface mount integrated circuit (IC) packages, which are generally characterized as being electrically and mechanically attached to the substrate of an electronic circuit assembly with a number of leads that are soldered, such as with a tin-lead solder, to both the IC package and to conductors formed on the substrate. The solder joints joining the leads to the conductors are subject to thermal stresses as a result of temperature fluctuations in the assembly's working environment and differences in coefficients of thermal expansion of the various materials used in the construction of the electronic assembly. These thermal stresses can potentially fatigue and fracture the solder joints, particularly if the IC package is subject to many temperature excursions, high temperatures on the order of 125° C. or more, or intense vibration. Under such conditions, the expected life of the solder joints can be significantly decreased. Notably, current integrated circuit packaging trends are toward IC packages with lower standoffs for the purpose of reducing the profile and overall size of the circuit board assembly, with the result being shorter and therefore less compliant leads. Consequently, such IC packages, known as thin small outline packages (TSOPs), are even more prone to solder joint fatigue.

The above is further aggravated by conformal coatings that are widely used in the electronics industry to form a protective barrier layer on the circuit board. Conformal coatings are generally formulated from polymeric materials of the silicone, acrylic, urethane and epoxy families, and serve to protect the electronic assembly from moisture and dirt, as well as make the IC packages mounted to the circuit board more resistant to vibration. However, the leads of an IC package support the package above the surface of the circuit board, such that a void is present between the surface mount IC package and its circuit board. Consequently, during the conformal coating process, there is a tendency for the conformal coating material to flow beneath the IC package and bridge the gap between the package and the circuit board. The result is that additional and particularly damaging stresses are induced in the leads due to the vast differences in coefficients of thermal expansion between the conformal coating material and the solder and lead materials. Further stresses are induced if the conformal coating material swells in reaction to contact with a solvent. Additional factors that affect lead and solder joint stresses include the conformal coating thickness, its bulk modulus of elasticity, the physical characteristics of the component and its leads, the size of the gap between the component and the board, and the coefficient of thermal expansion of the component and the board.

To reduce the effect of the stresses noted above on IC package leads and solder joints, the prior art has proposed the use of various materials for encapsulating the solder joints and leads of IC packages, and particularly the thin small outline packages noted above. For example, U.S. Pat. No. 5,243,133 to Engle et al. and U.S. Pat. No. 5,288,944 to Bronson et al. propose the use of a silica-filled epoxy resin. Engle et al. and Bronson et al. teach that their epoxy resins must be filled with an appropriate fill material in order to exhibit a suitable coefficient of thermal expansion, generally within 30 percent of the coefficient of thermal expansion of the solder joint to be encapsulated. Both Engle et al. and Bronson et al. also teach that a preferred epoxy resin is a heat-curable, at least partially filled cyclohexyldiepoxide resin available under the trademark Hysol FP0045 from the Dexter Corporation. This epoxy resin gels when exposed to 120° C. for one-half hour, and cures at 150° C. after a period of at least two to four hours.

While Engle et al. and Bronson et al. report that their epoxy resin performs well to improve solder point fatigue life, a significant shortcoming of their solution is the requirement to immediately cure the epoxy resin at a high temperature. Specifically, their epoxy resin is a low viscosity liquid (195 to 265 pascal-seconds at 25° C.) that must be fully cured to perform its intended function, and curing must take place at a temperature of 150° C. As is known in the art, temperatures of this magnitude reduce solderability of conductors by promoting the growth of tin-copper intermetallics, destroys organic solder materials, and can severely damage or destroy other electrical components on the electronic circuit assembly, such as electrolytic capacitors. Furthermore, 150° C. exceeds the glass transition temperature of many commercial epoxy and glass materials that form the circuit packages and other structures used in electronic assemblies.

In addition to the above material-related repercussions of requiring a 150° C. cure, significant process-related difficulties also arise. For example, the equipment required to cure the epoxy resin generally have a high capital cost, and the additional and extended curing operation complicates processing and adds further costs to the end product. In addition, the assembly must be carefully handled until the epoxy resin has been cured, in that low viscosity liquid epoxy resins of the type taught by Engle et al. and Bronson et al. will otherwise flow across the surface of the circuit board. Storage and handling of a curable epoxy resin can also be problematic, given the reduced shelf life of reactive curable polymer compounds of this type. Finally, heat-cured epoxy resins are irreversible, and therefore are not repairable.

From the above, it can be seen that it would be desirable if an improved solder joint encapsulation material were available that overcame the disadvantages of prior art materials, yet achieved the same result of significantly improving solder joint fatigue life of a surface mount IC package mounted to an electronic circuit assembly. More particularly, such an encapsulation material would preferably have less restrictive processing requirements, including a minimal cure time and temperature, so as to promote processing of the electronic circuit assembly and reduce capital and processing costs.

SUMMARY OF THE INVENTION

It is an object of this invention to provide an improved material for encapsulating the solder joints of a surface mount IC package, in which the material serves to encapsulate the solder joint so as to reduce stresses and therefore improve solder joint fatigue life.

It is another object of this invention that the material does not require curing at elevated temperatures capable of damaging other electronic components on the same circuit board.

It is yet another object of this invention that such a material is capable of being selectively and accurately applied in a manner that enables the material to fully encapsulate the solder joints.

It is a further object of this invention that use of the material requires minimal processing time, capital, floor space, labor and process inventory.

In accordance with a preferred embodiment of this invention, these and other objects and advantages are accomplished as follows.

According to the present invention, an encapsulation material is provided for encapsulating the leads and solder joints of a surface mount IC device mounted on the substrate of an electronic circuit assembly. The material is a hot melt material, and is therefore characterized by initially being a solid or semisolid at approximately room temperature, a liquid at an elevated temperature at which the hot melt material is applied onto the solder joints and leads, and thereafter quickly solidifying upon cooling. As such, the encapsulation material can be rapidly applied through various highly controllable techniques, and will quickly solidify to allow almost immediate handling of the circuit assembly. A preferred aspect of this invention is that a high temperature cure of 150° C. or more is unnecessary, such that other components of the circuit assembly are not subjected to potentially harmful elevated temperatures.

The encapsulation material of this invention is also reactive, indicating that the material undergoes a cure subsequent to its application. According to this invention, the encapsulation material is preferably a combination of at least two epoxy resins that are formulated with a curative. The curative is a latent curative with or without a moisture-activated curative, with the latent curative being capable of triggering a cure at an elevated temperature of less than 150° C. One of the epoxies is a solid or semisolid epoxy resin, such as a bisphenol A or epoxy novolac, while the second epoxy is either a solid, semisolid or liquid epoxy resin, such as a bisphenol A, bisphenol F or other comparable liquid epoxy resin. The encapsulation material of this invention also includes at least about 40 weight percent of a filler material, such as glass spheres.

To be ideally suited for encapsulating solder joints of a surface mount IC, the encapsulation material preferably has a coefficient of thermal expansion of about 25 to about 35 ppm/° C., a viscosity of not more than about 5000 centipoise (5 pascal-second) at its elevated application temperature, and a glass transition temperature that is greater than the intended service temperature of the surface mount IC. Furthermore, the encapsulation material is heat curable at a temperature of not more than 150° C., and at least partially curable at temperatures of about 120° C. or less.

In use, the encapsulation material of this invention is initially a solid or semisolid at room temperature, and must be heated to a sufficient temperature, such as about 45° C. to about 90° C., so as to become liquefied. A bead of the encapsulation material is then dispensed over the solder joints of an IC component on a circuit board, such that the encapsulation material completely covers each of the IC component's solder joints. Because of the hot melt characteristic of the encapsulation material, conventional hot melt dispensing equipment can be employed to accurately and rapidly form the bead. The bead is then allowed to cool in order to resolidify the encapsulation material. Upon cooling, the circuit board can be immediately handled due to the solid/semisolid nature of the encapsulation material. The encapsulation material undergoes a chemical reaction at room temperature or during subsequent processing or testing at an elevated temperature, such that cross-linking occurs to render the encapsulation material non-remeltable. In both the as-cooled solid and cured states, the encapsulation material serves to enhance the fatigue life of the encapsulated solder joints through reducing the stresses within the solder joints. As a result, the overall mechanical reliability of the IC component and the electronic circuit assembly is enhanced. In view of the above, it can be seen that a significant advantage of this invention is that the encapsulation material is able to enhance solder joint fatigue life while completely avoiding the prior art requirement for high temperature cures at temperatures of 150° C. and higher over durations of two hours and more. Accordingly, the likelihood of damaging other electronic components on the same circuit board can be completely eliminated. Furthermore as a hot melt material, and particularly a hot melt material having the above-noted viscosity at its application temperature, the encapsulation material is readily capable of being selectively and accurately applied in a manner that enables the encapsulation material to flow between adjacent leads, and thereby fully encapsulate each solder joint of an IC component. Finally, the characteristic of being a hot melt material enables the use of minimal processing time, capital, floor space, labor and process inventory for implementing the use of the encapsulation material within a manufacturing process, such that manufacturing costs are minimized.

In addition, the characteristic of being a reactive hot melt is advantageous in that the encapsulation material is able to fully cure by a secondary reaction that occurs over a period of time at a reduced temperature, such as during storage, or at a minimal elevated temperature attained during a subsequent processing or testing operation. Consequently, the advantages associated with cured polymer systems, such as stability and resistance to chemical attack, can be realized while retaining the advantages of hot melt dispensing methods.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

The present invention provides an encapsulation material for the lead solder joints of a surface mount IC component mounted on an electronic circuit assembly. The encapsulation material of this invention is characterized by being a reactive hot melt composition that can be applied at an elevated temperature, and then later undergo a cure at a temperature of less than 150° C., and preferably about 120° C. or less.

Figure 1:
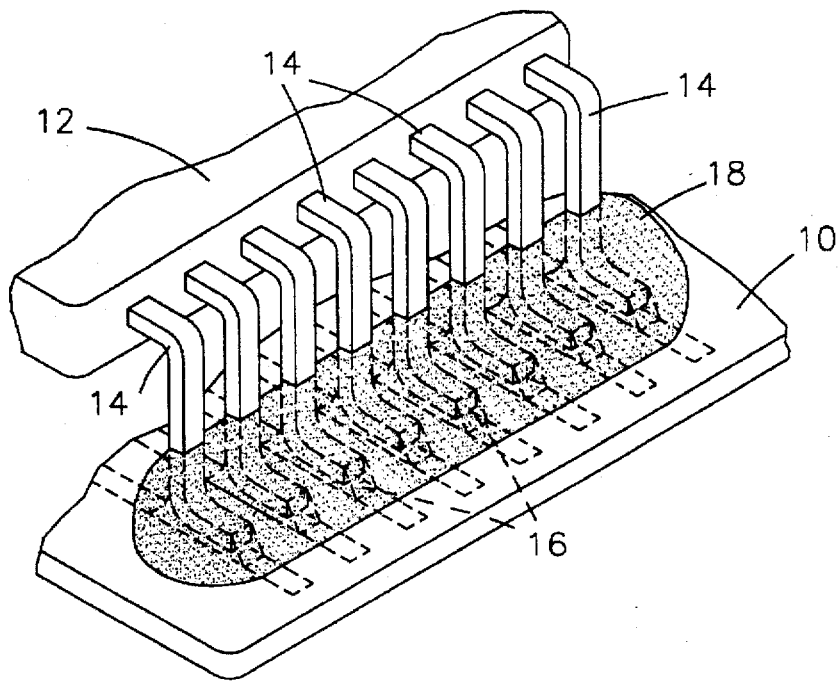
FIG. 1 is a perspective view of a portion of an electronic circuit assembly having a surface mount integrated circuit package mounted thereon, in which an encapsulation material has been applied to the assembly to encapsulate the package lead solder joints at the perimeter of the IC package in accordance with this invention.

FIG. 1 represents a typical application for the encapsulation material of this invention, and serves to illustrate some of the general concepts of this invention. Shown in FIG. 1 is a circuit board 10 on which is mounted a surface mount integrated circuit (IC) package 12. The circuit board 10 may be a ceramic substrate or a printed wiring board such as a polyimide, MYLAR, epoxy-glass or phenolic film. As is conventional, the package 12 is electrically and physically connected to the circuit board 10 with a number of leads 14 that are joined with solder 16 to conductors on the surface of the circuit board 10. The leads 14, which are typically formed from a copper alloy or another suitably conductive alloy, support the package 12 above the surface of the circuit board 10 as shown. The solder 16 is conventionally a tin-lead solder, though various solder compositions could foreseeably be used.

The above-described application is merely intended to represent generally conventional circuit assemblies. Therefore, the teachings of this invention are not limited to the specific configuration shown in the Figure, and are equally applicable to electronic assemblies that utilize essentially any type and combination of circuit components which include surface mount technology (SMT) IC packages and various lead designs. Accordingly, those skilled in the art will recognize that numerous variations of the illustrated electronic assembly are possible, all of which are within the scope of this invention.

Figure 2:
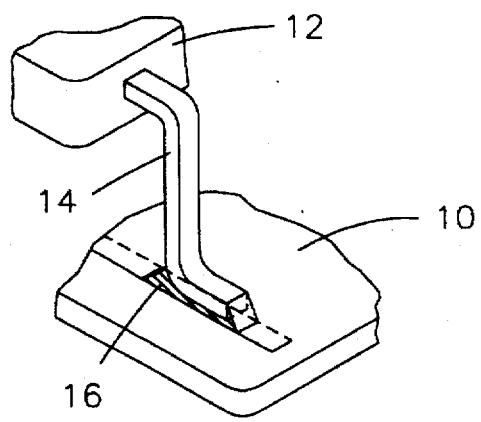
FIG. 2 is a perspective view of a single solder joint of FIG. 1 prior to encapsulation.
Figure 3:
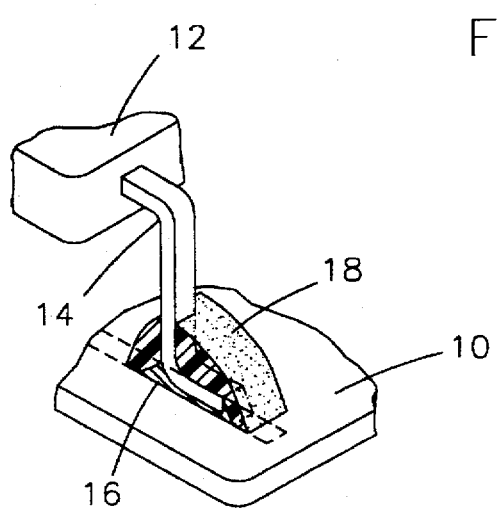
FIG. 3 is a perspective cross-sectional view of the solder joint of FIG. 2 following encapsulation in accordance with this invention.

Because of the differences in materials used to form the circuit board 10, package 12, leads 14 and solder 16, a mismatch in coefficients of thermal expansion exists. This mismatch generates stresses during temperature excursions that are primarily concentrated in the leads 14 and solder 16. To mitigate the adverse effect of such stresses, an encapsulant 18 is shown as being deposited on the circuit board 10 and over the solder 16. Generally, the encapsulant 18 may have a thickness on the order of about one to about three millimeters, though it is foreseeable that greater or lesser thicknesses might be used. Referring to FIGS. 2 and 3, a single lead 14 of the package 12 is shown in greater detail, with the encapsulant 18 being absent in FIG. 2, so as to better illustrate the typical appearance of the lead 14 and a solder joint formed by the solder 16. As shown, the portion of the lead 14 at the surface of the circuit board 10 can be generally described as having a toe at the terminal end of the lead 14 and a heel where the lead 14 bends upward to extend toward the package 12. Tests and modeling of leads of the type shown in the Figures have indicated that a maximum stress level is located at the heel of the lead 14, and that localized inelastic strain may occur in the heel with a temperature change of as little as 20° C.

FIG. 3 illustrates an identical lead 14 after deposition and curing of a suitable amount of the encapsulation material of this invention. As will be described in greater detail below, flow of the encapsulation material around the lead 14 and over the solder 16 is promoted by the low viscosity of the encapsulation material and by the method in which the encapsulation material is dispensed, both of which are achieved as a result of the encapsulation material being a hot melt composition. Tests and modeling similar to that previously noted have been conducted with leads encapsulated in accordance with the invention, with results indicating that the maximum stress level in the lead 14 is shifted toward the toe of the lead 14, and that the maximum stress level is less than one third of that observed for the non-encapsulated lead shown in FIG. 2. As such, a drastic improvement in fatigue life for a surface mount IC package lead can be achieved by employing the encapsulation material of this invention.

As noted above, a key aspect of the encapsulation material that forms the encapsulant 18 is its characterization as a reactive hot melt material, meaning that the encapsulation material is initially a solid or semisolid at roughly room temperature, melts to become a liquid at an elevated temperature at which the encapsulation material is deposited, and resolidifies upon cooling to approximately room temperature. As such, the encapsulation material can be rapidly applied through various highly controllable techniques, and will quickly and sufficiently solidify upon cooling to allow immediate handling of the electronic assembly. Furthermore, as a reactive material, the encapsulation material is characterized by undergoing a chemical reaction at room temperature or during subsequent processing or testing at an elevated temperature, such that cross-linking occurs to render the encapsulation material non-remeltable. In accordance with this invention, curing occurs at temperatures of less than 150° C., and preferably less than 120° C., such that thermal damage to other components on the circuit board 10 can be prevented.

The specific characteristics desired of the encapsulation material of this invention include the following. First, the encapsulation material must be capable of forming a solid with a cure temperature of less than 150° C. and preferably less than 120° C. In addition, the material's coefficient of thermal expansion after solidifying must be on the order of about 25 to 35 ppm/° C. in order to suitably match that of the solder 16, which is typically about 25 ppm/° C. As a hot melt material, the encapsulation material must initially be a solid or semisolid in order to allow loading into hot melt dispensing equipment. The encapsulation material must liquefy and reach a viscosity of not more than about 5000 centipoise, and preferably not more than about 1000 centipoise, when at a dispensing temperature in the range of about 45° C. to about 90° C. in order for the material to flow freely between the leads 14, though it is foreseeable that different viscosities may be acceptable, depending on the application method, the lead pitch, the desired thickness of the encapsulant 18, and the surface area to be covered. In addition, the encapsulation material should have a work life of at least about four to eight hours at the elevated dispensing temperature. Finally, the encapsulation material should be capable of achieving a minimum adhesion strength (lap shear) of 400 psi. Finally, the encapsulation material should preferably be suitable for the intended environment of the electronic assembly, which generally necessitates some degree of resistance to chemical attack and elevated temperatures.

According to the present invention, the above characteristics are achieved with an encapsulation material composed of at least two epoxies that are formulated with a curative and a filler material. The curative is either a latent curative that triggers a cure at a temperature of less than 150° C., and preferably less than about 120° C., or a combination of a latent curative and a moisture-activated curative. In a preferred embodiment, one of the epoxies is a solid or semisolid epoxy resin, while the second epoxy is a solid, semisolid or liquid epoxy resin. The first epoxy is preferably a bisphenol A or epoxy novolac, and constitutes at least about 20 weight percent of the combined epoxies, and preferably about 90 to about 100 weight percent of the combined epoxies and about 20 weight percent of the encapsulation material. Particularly suitable solid/semisolid epoxies are EPON 836 and TACTIX 742. EPON 836 is a semisolid bisphenol A epoxy resin commercially available from the Shell Chemical Company, and characterized as a fusion resin with a low melting point. TACTIX 742 is a solid or semisolid multifunctional epoxy resin based on the reaction product of epichlorohydrin and methylidynetrisphenol, with a reaction product CAS number of 066072-38-6, and commercially available from Dow Chemical. These epoxy resins are characterized by low coefficients of thermal expansion, and are resistant to heat and chemicals. The second epoxy is preferably bisphenol A, bisphenol F or any other liquid epoxy resin, and constitutes at most about 80 weight percent of the combined epoxies, and preferably about 20 weight percent or less of the combined epoxies and about 1 to about 3 weight percent of the encapsulation material. A particularly suitable epoxy is EPON 825, a high purity bisphenol A epoxy resin based on diglycidyl ether of bisphenol A and commercially available from the Shell Chemical Company.

As indicated above, the curative employed in this encapsulation material is either a latent curative in an amount of up to about 3 weight percent of the encapsulation material, or a combination of a latent curative and a moisture-activated curative in a combined amount of up to about 10 weight percent of the encapsulation material, though preferably about 1 to about 5 weight percent of the encapsulation material. A suitable latent curative is an imidazole, such as CUREZOL C17Z, available from Air Products and Chemicals, Inc. and made by Shikoku Chemical Corporation. This particular curative is characterized as a solid at room temperature, having a melting temperature of about 86° C. to about 91° C., heat and chemical resistance, a pot life of about six days at room temperature, and a gel time at about 70° C. of more than seventeen hours. Another suitable latent curative is amine adduct with an epoxy resin, such as PN-23, available from Ajinomoto. A suitable moisture-activated curative for use in combination with the latent curative is a ketimine, such as the compounds available under the names H-1, H-2 and H-3 from the Shell Chemical Company.

Finally, the filler material constitutes at least 40 weight percent of the encapsulation material in order to reduce the coefficient of thermal expansion (CTE) of the encapsulation material. Because the remainder of the encapsulation material has a CTE well in excess of that of the solder 16, the filler material is necessary to reduce the CTE of the encapsulation material to the desired range of about 25 to about 35 ppm/° C. Glass materials have a low CTE, such that glass particles are suitable as the filler material for the purpose of offsetting the relatively high CTE of the polymeric constituents of the encapsulation material. A suitable glass material for the filler includes "A" glass, though glass materials such as "E" glass, "S" glass, fly ash, silica, spherical silica and spherical alumina could also be used. The glass particles are preferably surface-treated with a coupling agent to improve wetting and adhesion of the epoxies. A suitable coupling agent is an epoxy-silane, such as UCAR a-187 available from Union Carbide.

Advantageously, spherical glass materials are commercially available in discrete particle sizes, which enables different particle sizes to be blended in appropriate proportions so that smaller particles will fit in the interstices formed by the larger particles. With this packing technique, the required CTE of the encapsulation material can be attained while retaining the necessary flow characteristics for the material. In practice, the use of three different sizes of glass particles has performed well, particularly if the largest particles constitute a greater proportion of the filler material than the smaller particles. If different particle sizes are used, a preferred size distribution is a diameter of about 40 to about 100 micrometers for the largest particles, a diameter of about 8 to about 30 micrometers for the intermediate sized particles, and a diameter of less than about 5 micrometers for the smallest particles. With this size distribution, a bimodal or trimodal packing technique minimizes the filler loading effect on the resin system while promoting a reduction in CTE.

Particularly suitable formulations for the encapsulation material of this invention include the following:

| Ingredients | Formulations (in weight %) | | | |
|---|---|---|---|---|
| | A | B | C | D |
| Epoxies | | | | |
| EPON 836 | 20.3 | 22.3 | — | — |
| TACTIX 742 | — | — | 19.7 | 19.7 |
| EPON 825 | 1.9 | 0.9 | 2.55 | 0 |
| Curative | | | | |
| C17Z | — | 0.9 | — | 1.0 |
| PN-23 | 1.9 | — | 2.55 | — |
| Glass | | | | |
| 29 μm A glass | 75.8 | 75.8 | 75.1 | 75.9 |
| Coupling Agent | | | | |
| a-187 | 0.1 | 0.1 | 0.1 | 0.1 |

The above formulations were characterized by a melting point of about 35° C., a viscosity of less than about 1000 centipoise (1 pascal-second) at a temperature of about 45° C. to 90° C., a glass transition temperature of about 115° C. to greater than 200° C. after final cure, a pot life (time to double in viscosity) of about 15 days at room temperature, and a CTE of about 30 to about 34 ppm/° C. after final cure. The above formulations could be modified to include up to about ten weight percent of a moisture-activated curative.

From the above, it is apparent that formulations A through D meet the criteria established for the encapsulation material of this invention. Each resolidifies upon returning to room temperature, and upon reheating will gel after about fifteen minutes at about 100° C., about six minutes at about 120° C., and about ninety seconds at about 150° C. An initial cure occurs by maintaining an elevated temperature for longer periods, such as about thirty minutes at a temperature of about 120° C. An initial cure is adequate to achieve an initial CTE of about 30 to about 32 ppm/° C., and an initial glass transition temperature of about 70° C. to about 110° C., which is sufficiently high for many applications. Advantageously, temperatures of up to about 120° C. are typically sustained for durations sufficient to achieve an initial cure during typical processing of an electronic circuit assembly, such as during a wave soldering operation or during a glue cure or reflow operation performed on another component of the circuit assembly. As a result, the encapsulation materials of this invention will often not require a cure operation specifically intended for the encapsulant, but instead can be cured during normal processing subsequent to the encapsulation material being dispensed on the leads and solder joints of a package.

In addition, because of the presence of the latent or combined latent/moisture curatives, the encapsulation materials of this invention will continue to cure during normal operation of the circuit assembly, whose operating temperatures may be as high as about 150° C. or more. As such, a full cure will typically be attained, with the degree of cure advantageously increasing as the service temperature of the encapsulation material increases. Alternatively, the encapsulation material formulations of this invention can be fully cured at temperatures in excess of 150° C. in as little as about two minutes or less, i.e., an insufficient duration to damage the other components of the circuit assembly. In contrast, the prior art encapsulating materials of U.S. Pat. No. 5,243,133 to Engle et al. and U.S. Pat. No. 5,288,944 to Bronson et al. require exposure at 150° C. for at least two hours to achieve a full cure, a duration sufficient to cause growth of tin-copper intermetallics that adversely affect solderability during processing, and the destruction of organic solder materials and certain components such as electrolytic capacitors.

The above formulations, as well as other encapsulation material formulations within the scope of this invention, can be advantageously dispensed in a manner conventional to hot melt adhesives known in the art. The solid or semisolid encapsulation material is heated to a temperature above its melting temperature, such as about 45° C. to about 90° C., so as to become liquefied. Hot melt equipment can than be used to dispense a bead of the encapsulation material over the solder joints of an IC component mounted on a circuit board, such that the encapsulation material completely covers each of the IC component's solder joints. Because hot melt dispensing equipment is employed, the encapsulation material of this invention can be accurately and rapidly deposited on the solder joints to form a continuous bead that completely envelopes the solder joints. If desired, the circuit board can be preheated to a temperature of about 40° C. to about 60° C. in order to facilitate flow of the encapsulation material. The bead is then allowed to cool in order to resolidify the encapsulation material. After cooling, the encapsulation material undergoes a chemical reaction at room temperature or during subsequent processing or testing at an elevated temperature, such that cross-linking occurs to render the encapsulation material nonremeltable. Solidification of the bead provides an encapsulation of the solder joints that serves to enhance their fatigue life through reducing the stresses within. As a result, the overall mechanical reliability of the IC component and the electronic circuit assembly is enhanced.

While our invention has been described in terms of a preferred embodiment, it is apparent that other forms could be adopted by one skilled in the art; for example, by substituting appropriate materials which achieve the desired characteristics of the reactive hot melt encapsulation material of this invention. Accordingly, the scope of our invention is to be limited only by the following claims.

What is claimed is:

1. An encapsulation material for encapsulating leads and solder joints of a surface mount integrated circuit device mounted on an electronic circuit assembly, the encapsulation material being a reactive hot melt material characterized by being a solid or semisolid at approximately room temperature, a liquid at an elevated application temperature of about 45° to about 90° C. at which the encapsulation material is applied to the leads and solder joints, and resolidifying upon cooling to room temperature so as to enable immediate handling of the electronic circuit assembly, the encapsulation material comprising at least two epoxy materials and a latent curative that triggers curing at a temperature of less than about 150° C., a first epoxy of the at least two epoxy materials being a solid or semisolid at room temperature, a second epoxy of the at least two epoxy materials being a solid, semisolid or liquid at room temperature, the encapsulation material further comprising a filler material so as to have a coefficient of thermal expansion of about 25 to about 35 ppm/° C., the encapsulation material having a viscosity of not more than about 5000 centipoise at the elevated application temperature.

2. An encapsulation material as recited in claim 1 wherein the first epoxy is selected from the group consisting of bisphenol A and epoxy novolac, and constitutes at least about 20 weight percent of the at least two epoxy materials.

3. An encapsulation material as recited in claim 1 wherein the second epoxy is a liquid epoxy resin selected from the group consisting of bisphenol A and bisphenol F, and constitutes at most about 80 weight percent of the at least two epoxy materials.

4. An encapsulation material as recited in claim 1 wherein the encapsulation material is fully curable at a temperature in excess of about 150° C. in about two minutes or less.

5. An encapsulation material as recited in claim 1 wherein the filler material is glass spheres that constitute at least about 40 weight percent of the encapsulation material.

6. An encapsulation material as recited in claim 5 wherein the filler material is a trimodal distribution of particles comprising a larger size particle range, an intermediate size particle range, and a smaller size particle range, and wherein the larger size particle range constitutes proportion of the filler material than the smaller size particle range and the intermediate size particle range combined.

7. An encapsulation material as recited in claim 1 wherein the encapsulation material consists essentially of:

a first epoxy being a solid or semisolid at room temperature and constituting about 20 weight percent of the encapsulation material;

a second epoxy being a solid, semisolid or liquid at room temperature and constituting up to about 3 weight percent of the encapsulation material;

the latent curative triggering curing at a temperature of not more than 120° C. and constituting up to about 3 weight percent of the encapsulation material; and a filler material constituting about 75 weight percent of the encapsulation material.

8. An electronic assembly having a substrate with a conductive member, the electronic assembly comprising:

a surface mount integrated circuit device mounted to the substrate;

a lead extending from the surface mount integrated circuit device and in electrical contact with the conductive member;

solder bonding the lead to the conductive member so as to form a solder joint; and an encapsulation material encapsulating the solder joint, the encapsulation material being formed from a reactive hot melt material characterized by being a solid or semisolid at approximately room temperature, being a liquid at an elevated application temperature of about 45° to about 90° C. at which the encapsulation material is applied to the solder joint, and resolidifying upon cooling to room temperature so as to enable immediate handling of the electronic circuit assembly, the encapsulation material comprising at least two epoxy materials and a latent curative that triggers curing at a temperature of less than 150° C., a first epoxy of the at least two epoxy materials being a solid or semisolid at room temperature, a second epoxy of the at least two epoxy materials being a solid, semisolid or liquid at room temperature, the encapsulation material further comprising a filler material so as to have a coefficient of thermal expansion of about 25 to about 35 ppm/° C., the encapsulation material having a viscosity of not more than about 5000 centipoise at the elevated application temperature.

9. An electronic assembly as recited in claim 8 wherein the reactive hot melt material has a viscosity of not more than about 1000 centipoise at the elevated application temperature.

10. An electronic assembly as recited in claim 8 wherein the encapsulation material is heat curable at a temperature of not more than 120° C.

11. An electronic assembly as recited in claim 8 wherein the filler material is glass spheres that constitute at least about 40 weight percent of the encapsulation material, the filler material being a trimodal distribution of particles comprising a larger size particle range, an intermediate size particle range, and a smaller size particle range, and wherein the larger size particle range constitutes a greater proportion of the filler material than the smaller size particle range and the intermediate size particle range combined.

12. An electronic assembly as recited in claim 8 wherein the first epoxy of the at least two epoxy materials is a solid or semisolid at room temperature and constitutes about 20 weight percent or more of the at least two epoxy materials, and wherein the second epoxy of the at least two epoxy materials is a solid, semisolid or liquid at room temperature.

13. An electronic assembly as recited in claim 8 wherein the first epoxy is selected from the group consisting of bisphenol A and epoxy novolac and constitutes at least about 90 weight percent of the at least two epoxy materials, and wherein the second epoxy is liquid epoxy resin selected from the group consisting of bisphenol A and bisphenol F.

* * * * *